(12) United States Patent
Sakaguchi et al.

(10) Patent No.: US 10,923,784 B2
(45) Date of Patent: Feb. 16, 2021

(54) HEAT-CONDUCTIVE SHEET AND BATTERY PACK USING SAME

(71) Applicant: Panasonic Intellectual Property Management Co., Ltd., Osaka (JP)

(72) Inventors: Yoshiya Sakaguchi, Kyoto (JP); Takeshi Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 108 days.

(21) Appl. No.: 16/076,499

(22) PCT Filed: May 9, 2017

(86) PCT No.: PCT/JP2017/017441
§ 371 (c)(1),
(2) Date: Aug. 8, 2018

(87) PCT Pub. No.: WO2017/208736
PCT Pub. Date: Dec. 7, 2017

(65) Prior Publication Data
US 2019/0051953 A1 Feb. 14, 2019

(30) Foreign Application Priority Data
May 30, 2016 (JP) .............................. JP2016-106944

(51) Int. Cl.
*H01M 10/613* (2014.01)
*H01M 10/653* (2014.01)
(Continued)

(52) U.S. Cl.
CPC .............. *H01M 10/613* (2015.04); *B32B 9/00* (2013.01); *B32B 9/007* (2013.01);
(Continued)

(58) Field of Classification Search
CPC ............. H01M 10/647; H01M 10/653; H01M 10/6555
See application file for complete search history.

(56) References Cited

U.S. PATENT DOCUMENTS 8,273,209 B2 * 9/2012 Hattori ...................... B32B 7/12
156/297
2010/0132871 A1 6/2010 Hattori et al.
2012/0009455 A1 1/2012 Yoon

FOREIGN PATENT DOCUMENTS

| CN | 102315501 A | 1/2012 | |
|---|---|---|---|
| EP | 2405528 A1 * | 1/2012 | .......... H01M 10/615 |
| JP | 2015-071727 | 4/2015 | |

OTHER PUBLICATIONS

International Search Report of PCT application No. PCT/JP2017/017441 dated Aug. 1, 2017.
(Continued)

*Primary Examiner* — Ula C Ruddock
*Assistant Examiner* — Thomas H. Parsons
(74) *Attorney, Agent, or Firm* — McDermott Will and Emery LLP (57) ABSTRACT

A heat-conductive sheet includes first and second insulating sheets placed on each other and a graphite sheet disposed between the first and second insulating sheets. The graphite sheet is entirely sealed by the first and second insulating sheets. The graphite sheet has a first slit provided therein. The first and second insulating sheets have a second slit passing through the first and second insulating sheets. The second slit is located inside the first slit of the graphite sheet.

22 Claims, 6 Drawing Sheets

(51) Int. Cl.
*H01M 10/6555* (2014.01)
*B32B 9/00* (2006.01)
*H01M 10/647* (2014.01)
*H05K 7/20* (2006.01)
*H01M 2/10* (2006.01)

(52) U.S. Cl.
CPC ....... *H01M 2/1016* (2013.01); *H01M 10/647* (2015.04); *H01M 10/653* (2015.04); *H01M 10/6555* (2015.04); *H05K 7/20* (2013.01)

(56) References Cited

OTHER PUBLICATIONS

English Translation of Chinese Search Report dated Apr. 21, 2020, for the related Chinese Patent Application No. 201780015175.1.

* cited by examiner

HEAT-CONDUCTIVE SHEET AND BATTERY PACK USING SAME

CROSS-REFERENCE TO RELATED APPLICATIONS

This application is a U.S. national stage application of the PCT international application No. PCT/JP2017/017441 filed on May 9, 2017, which claims the benefit of foreign priority of Japanese patent application No. 2016-106944 filed on May 30, 2016, the contents all of which are incorporated herein by reference.

TECHNICAL FIELD

The present invention relates to a heat-conductive sheet and a battery pack including the heat-conductive sheet.

BACKGROUND ART

Lithium-ion secondary batteries have been often mounted into various apparatuses, and their current capacities also have increased. As the current capacities of the lithium-ion secondary batteries increase, the importance of the countermeasures against heat becomes increasingly great. A lithium-ion secondary battery is used as a battery module including plural battery cells connected to each other. In such a battery module, when the temperature difference between the battery cells increases or the temperature of a battery cell increases, the degradation of a battery cell having a high temperature progresses. Therefore, measures of making the heat uniform become important. The making heat uniform can be achieved by disposing a heat conductor in the battery module. A graphite sheet is used as the heat conductor.

A heat conductor similar to the above heat conductor is disclosed in, e.g. PTL 1.

CITATION LIST

Patent Literature

PTL 1: Japanese Patent Laid-Open Publication No. 2015-71727

SUMMARY

A heat-conductive sheet includes first and second insulating sheets placed on each other and a graphite sheet disposed between the first and second insulating sheets. The graphite sheet is entirely sealed by the first and second insulating sheets. The graphite sheet has a first slit provided therein. The first and second insulating sheets have a second slit passing through the first and second insulating sheets. The second slit is located inside the first slit of the graphite sheet.

Even if the graphite sheet has an area, this heat-conductive sheet can be attached onto a heating element without leaving bubbles between the heat-conductive sheet and the heating element.

DETAILED DESCRIPTION OF PREFERRED EMBODIMENT

Figure 1A:
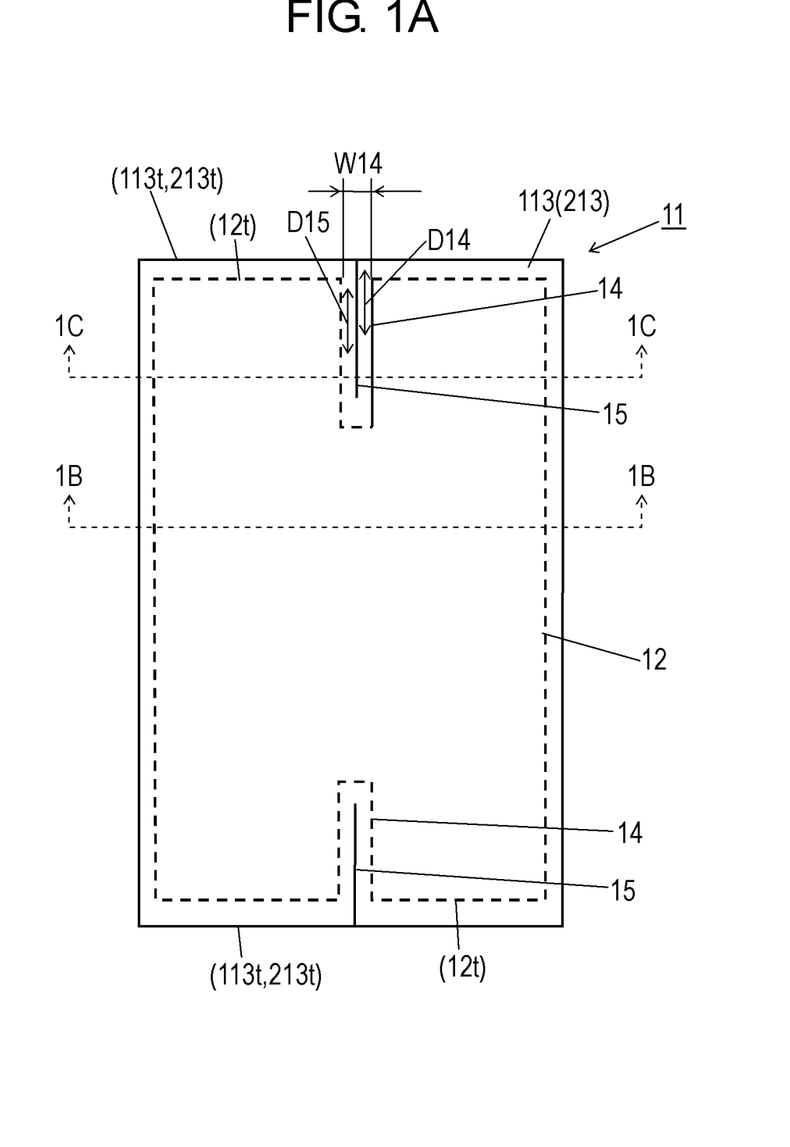
FIG. 1A is a plan view of a heat-conductive sheet in accordance with an exemplary embodiment.
Figure 1B:
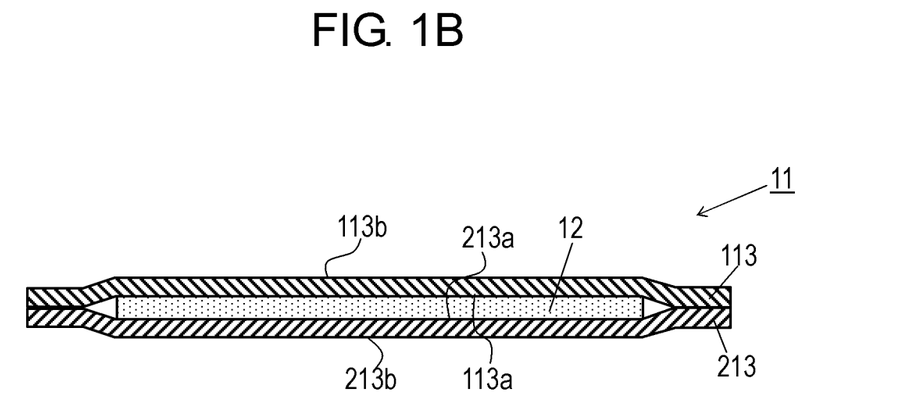
FIG. 1B is a sectional view of the heat-conductive sheet along line 1B-1B shown by FIG. 1A.
Figure 1C:
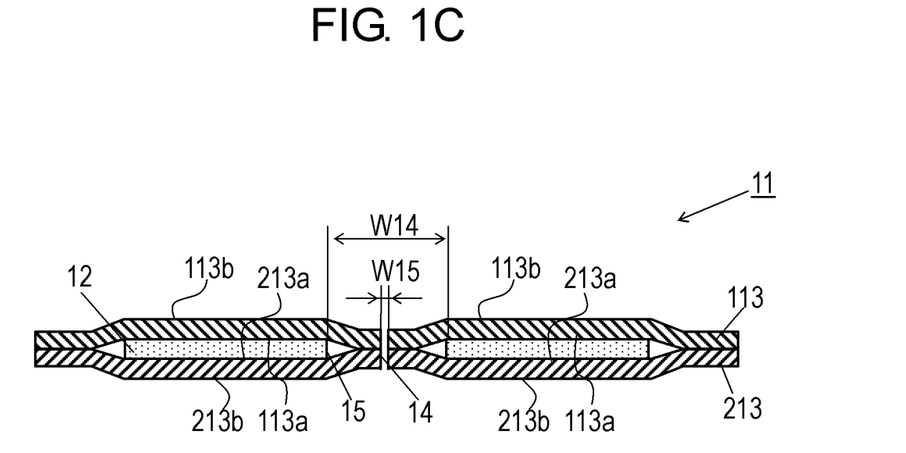
FIG. 1C is a sectional view of the heat-conductive along line 1C-1C sheet shown by FIG. 1A.

FIG. 1A is a plan view of heat-conductive sheet 11 in accordance with an exemplary embodiment. FIG. 1B is a sectional view of heat-conductive sheet 11 along line 1B-1B shown by FIG. 1A. FIG. 1C is a sectional view of heat-conductive sheet 11 along line 1C-1C shown by FIG. 1A. Insulating sheets 113 and 213 made of polyethylene terephthalate (hereinafter referred to as "PET") with thicknesses of about 10 μm are attached onto opposite surfaces of graphite sheet 12 with a thickness of about 50 μm. Acrylic adhesive agent is disposed on each of surfaces 113a and 213a of insulating sheets 113 and 213 that face graphite sheet 12. The areas of insulating sheets 113 and 213 are larger than the area of graphite sheet 12. Insulating sheet 113 is bonded to insulating sheet 213 with the adhesives at portions of insulating sheet 113 on which graphite sheet 12 is not provided, thus entirely sealing graphite sheet 12. In other words, the entire peripheries of insulating sheets 113 and 213 are bonded to each other. Graphite sheet 12 has slits 14 therein extending slenderly in extending direction D14. In accordance with the embodiment, width W14 of slits 14 in a direction perpendicular to extending direction D14 is about 2 mm. The periphery of each slit 14 is sealed by insulating sheets 113 and 213. In other words, insulating sheets 113 and 213 are bonded to each other inside slit 14. Inside slit 14, slit 15 passing through insulating sheets 113 and 213 and extends slenderly in extending direction D15 parallel with surfaces 113a, 113b, 213a, and 213b is provided in insulating sheets 113 and 213. In accordance with the embodiment, width W15 of slits 15 in a direction perpendicular to extending direction D15 is about 0.1 mm. The entire periphery of graphite sheet 12 is covered with insulating sheets 113 and 213, so that graphite powder generated from graphite sheet 12 does not come out of insulating sheets 113 and 213. In accordance with the embodiment, extending direction D14 of slits 14 is identical to extending direction D15 of slits 15, but may be different from extending direction D15.

In order to efficiently transmit heat with a heat conductor, the heat conductor is preferably bonded with no gap to a heating element, such as a battery cell, with an adhesive that is disposed on a surface the heat conductor contacting the heating element. In the case that a heat conductor is used for a small electronic device, such as a portable phone, the heat conductor can be satisfactorily attached onto the electronic device because the graphite sheet is also small. In the case that the heat conductor is attached onto a large heating element, such as an in-car battery cell, the graphite sheet has a large surface area accordingly. When this heat conductor is to be attached onto the battery cell, bubbles may remain between the adhesive and the battery cell. When bubbles exist between the adhesive and the battery cell, a temperature rose of the battery cell causes the air in the bubbles to expand, and enlarges the bubbles. As a result, the difference between the maximum temperature and minimum temperature in the temperature distribution in the battery cell may become large.

In the case that heat-conductive sheet 11 according to the embodiment has a large surface area, air can be discharged from slits 15 even when heat-conductive sheet 11 is attached onto a heating element, such as a battery cell. Therefore, heat-conductive sheet 11 can be attached onto the heating element without leaving bubbles between heat-conductive sheet 11 and the heating element.

Width W15 of slits 15 may be extremely narrow as long as air can pass through it. Excessively large width W15 of slits 15 reduces the thermal uniformity, so that width W15 is preferably equal to or smaller than 0.2 mm. Slit 15 may be a cut-out having width W15 of substantially zero.

In order to form slits 15 and seal the peripheries of slits 14 with insulating sheets 113 and 213, width W14 of slits 14 is preferably equal to or larger than 1.0 mm. Excessively large width W14 of slits 14 reduces the thermal uniformity, so that width W14 is equal to or smaller than 2.0 mm.

At least one of insulating sheets 113 and 213 is preferable made of a double-sided tape having an adhesive on opposite surfaces thereof. Thus, heat-conductive sheet 11 can be directly attached onto a heating element, such as a battery cell. In other words, surface 113a of insulating sheet 113 that faces graphite sheet 12 and insulating sheet 213 may have adhesiveness while surface 113b opposite to surface 113a also may have adhesiveness. Surface 213a of insulating sheet 213 that faces graphite sheet 12 and insulating sheet 113 may have adhesiveness while surface 213b opposite to surface 213a also may have adhesiveness.

A method of manufacturing heat-conductive sheet 11 will be described below.

First, a polyimide film is thermally decomposed, graphitized, and then tanned, thereby obtaining flexible graphite sheet 12. Next, by punching graphite sheet 12 with a die or by laser processing graphite sheet 12, slit 14 is formed in graphite sheet 12. Insulating sheets 113 and 213 are attached onto opposite surfaces of graphite sheet 12. Then, slit 15 is formed in portion of insulating sheets 113 and 213 at a central part of each slit 14.

Figure 2:
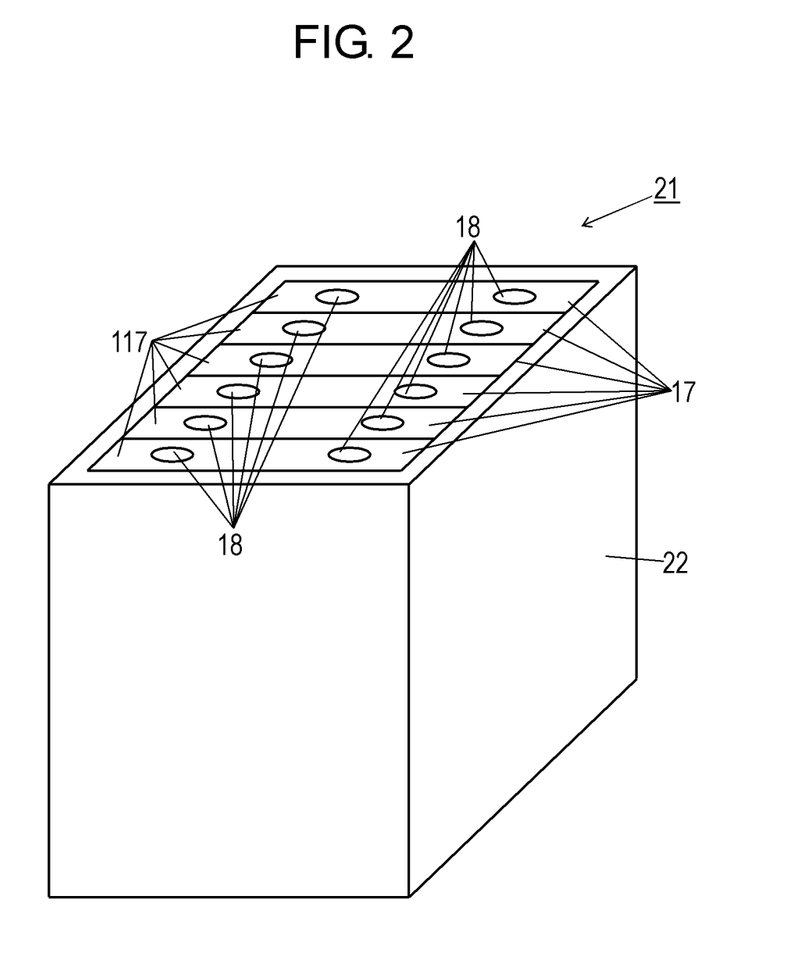
FIG. 2 is a top perspective view of a battery pack including the heat-conductive sheet in accordance with the embodiment.

FIG. 2 is a top perspective view of battery pack 21 including heat-conductive sheet 11 in accordance with the embodiment. Battery pack 21 includes metal case 22 and plural battery cells 17 accommodated in case 22.

Figure 3:
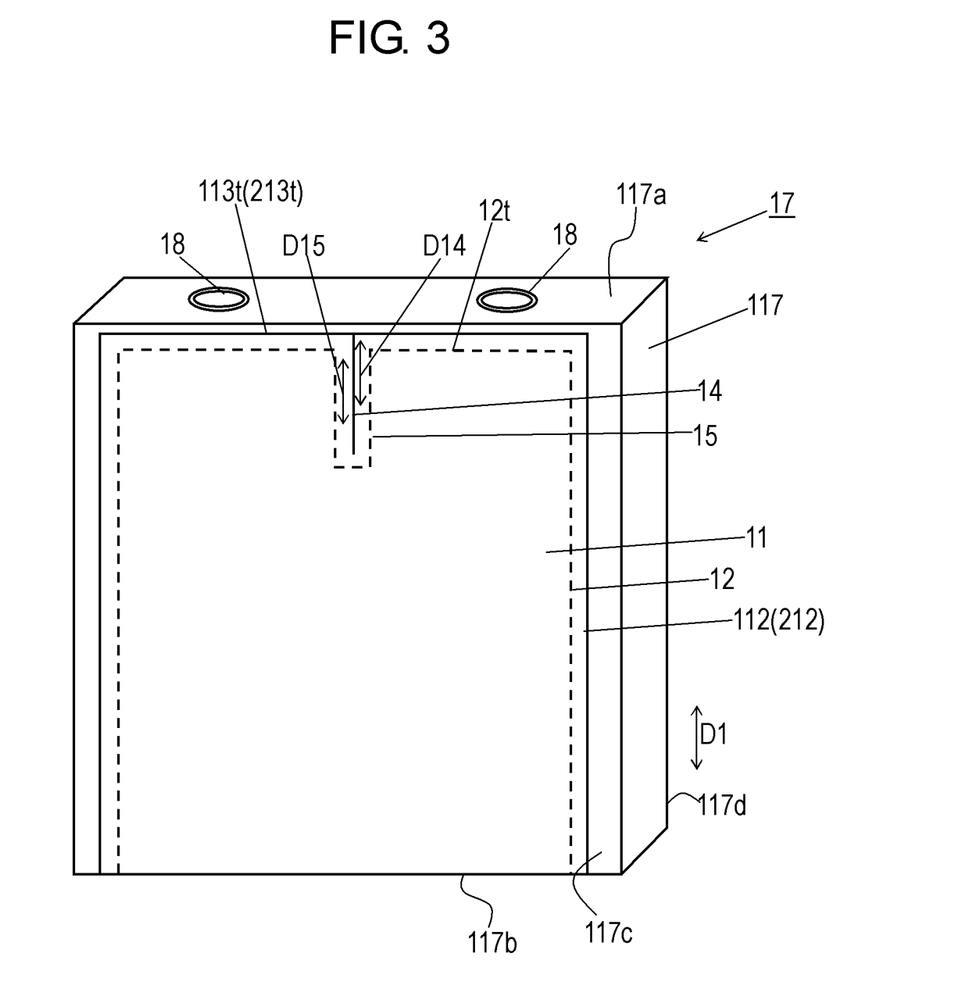
FIG. 3 is a top perspective view of a battery cell of the battery pack in accordance with the embodiment.
Figure 4:
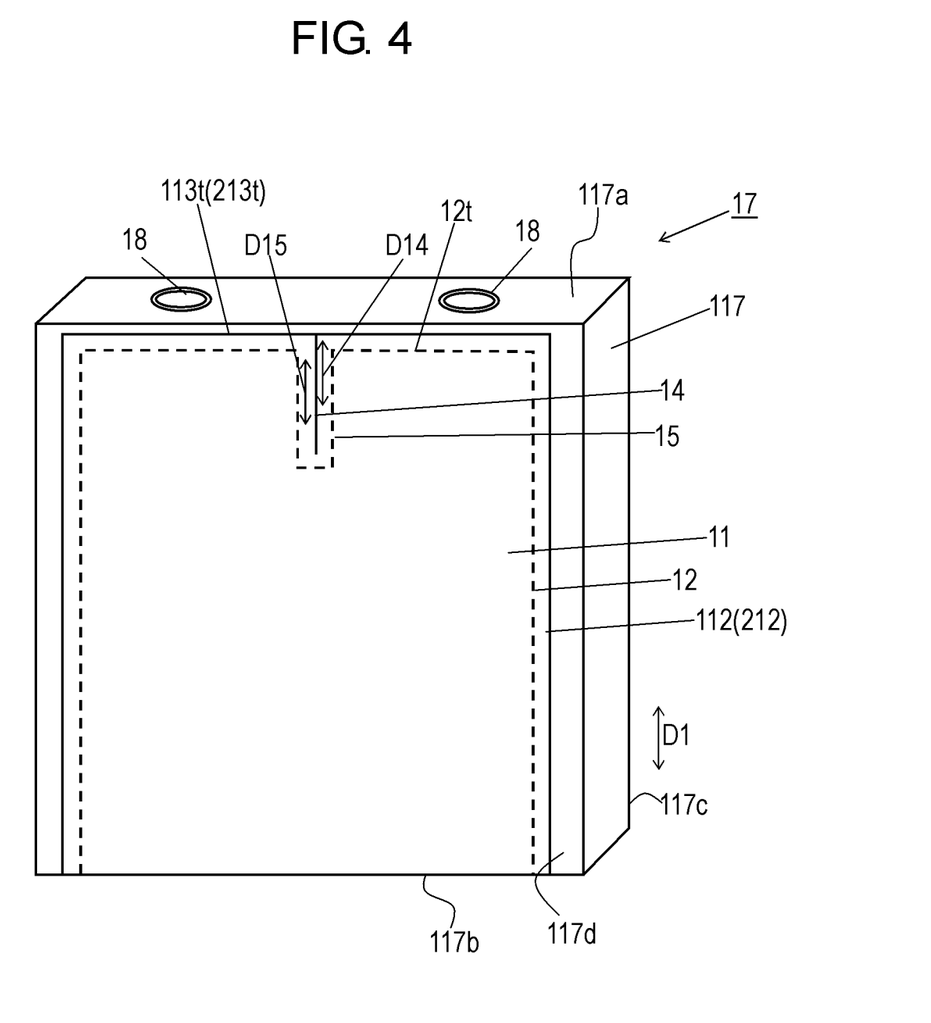
FIG. 4 is a top perspective view of the battery cell in accordance with the embodiment.
Figure 5:
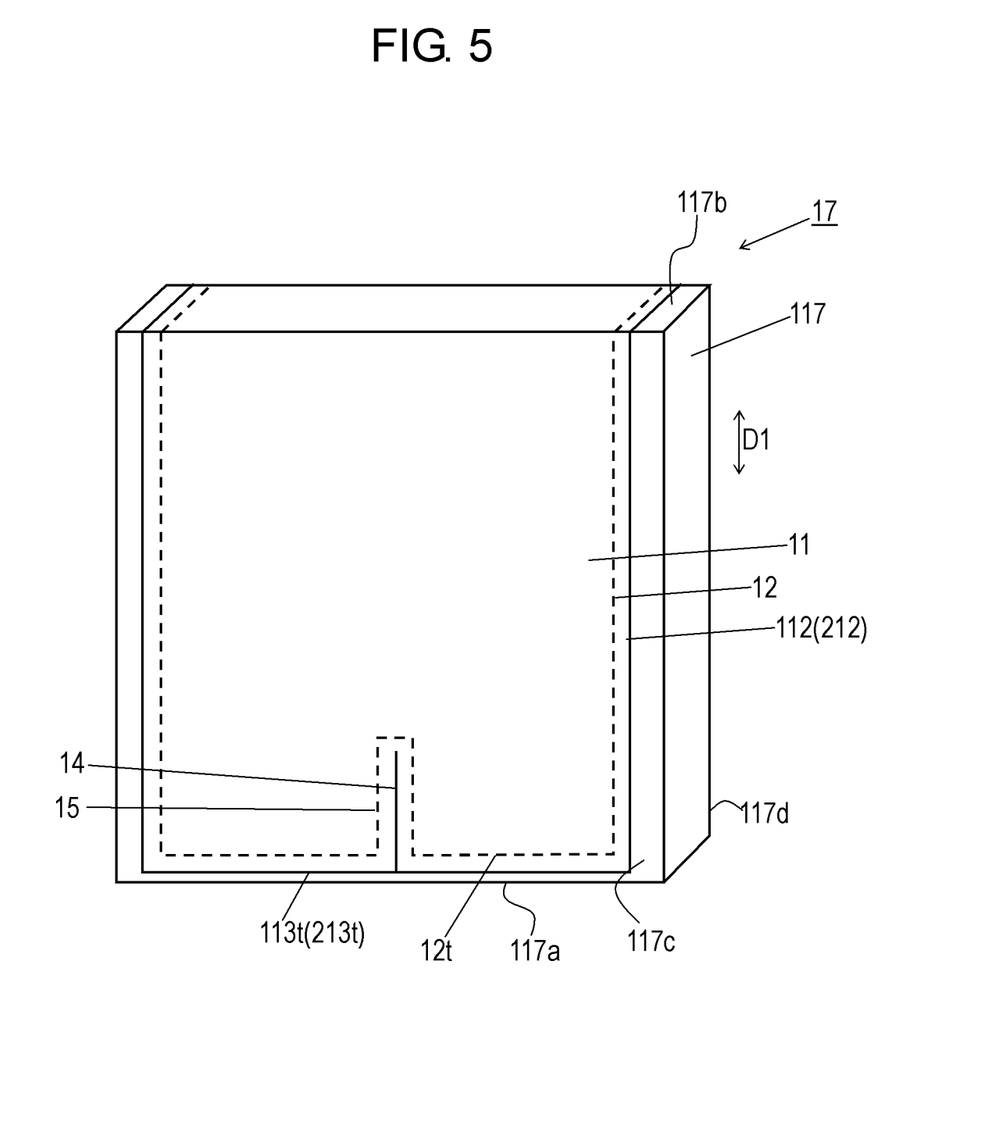
FIG. 5 is a bottom perspective view of the battery cell in accordance with the embodiment.

FIG. 3 and FIG. 4 are top perspective views of battery cell 17. FIG. 5 is a bottom perspective view of battery cell 17. Heat-conductive sheet 11 is attached onto battery cell 17. In accordance with the embodiment, battery cell 17 is a square lithium-ion battery, and includes battery cell body 117 serving as a battery and terminal electrodes 18 provided on battery cell body 117. Battery cell body 117 has upper surface 117a, lower surface 117b, side surface 117c, and side surface 117d opposite to side surface 117c. Side surface 117c is connected with upper surface 117a and lower surface 117b. Side surface 117d is connected with upper surface 117a and lower surface 117b. Terminal electrodes 18 are disposed on upper surface 117a. Heat-conductive sheet 11 is attached onto side surface 117c, lower surface 117b, and side surface 117d of battery cell body 117. This configuration decreases the difference between the maximum temperature and the minimum temperature in the temperature distribution of battery cell 17, and allows heat to be dissipated from lower surface 117b to case 22 to decrease the temperature of battery cell 17.

Slit 15 extends slenderly from one end of graphite sheet 12 in a direction crossing upper surface 117a and lower surface 117b of battery cell body 117. In accordance with the embodiment, slit 15 extends slenderly in up-down direction D1, namely in a direction crossing upper surface 117a and lower surface 117b of battery cell body 117. In detail, slit 15 extends slenderly downward from upper end 12t of graphite sheet 12. Slit 14 extends slenderly in up-down direction D1, and, in detail, slit 14 extends slenderly downward from upper ends 113t and 213t of insulating sheets 113 and 213.

Insulating sheets 213 of heat-conductive sheets 11 attached onto adjacent battery cells 17 out of plural battery cells 17 accommodated in case 22 contact each other. Insulating sheets 213 of heat-conductive sheets 11 attached onto battery cells 17 out of plural battery cells 17 located at the opposite ends accommodated and arranged in case 22 contact case 22. This configuration allows the heat generated by battery cells 17 to transmit to case 22 via heat-conductive sheets 11 contacting each other.

In order for a heat conductor to efficiently transmit heat, the heat conductor is preferably bonded securely to a heating element, such as battery cell 17, with an adhesive provided on a surface of the heat conductor contacting the heating element. In the case that the heat conductor is used for a small electronic device, such as a portable phone, the heat conductor can be satisfactorily attached onto the electronic device since the graphite sheet is small accordingly. In the case that the heat conductor is attached onto a large heating element, such as an in-car battery cell, the graphite sheet has a large area accordingly. When this heat conductor is to be attached onto the battery cell, bubbles may remain between the adhesive and the battery cell. When bubbles exist between the adhesive and the battery cell, a temperature rise of the battery cell expands the air in the bubbles and enlarges the bubbles. As a result, the difference between the maximum temperature and the minimum temperature in the temperature distribution in the battery cell increases accordingly.

In the case that battery cell 17 is a square lithium-ion battery, a heat amount at a region of battery cell 17 close to terminal electrodes 18 tends to be the largest. Therefore, slits 14 preferably extend downward from upper surface 117a of battery cell body 117. The heat generated by battery cell 17 transmits from upper surface 117a of battery cell body 117 (battery cell 17) to lower surface 117b thereof, and can further decrease the difference between the maximum temperature and the minimum temperature in the temperature distribution in battery cell 17. In the case that heat-conductive sheet 11 is attached onto battery cell 17, air can be discharged from slits 15, and heat-conductive sheet 11 can be bonded securely to battery cell 17 without leaving bubbles in a region battery cell 17 close to terminal electrodes 18 with a high temperature. Therefore, heat-conductive sheet 11 can effectively transmit the heat generated in battery cell 17, thus providing battery pack 21 with high reliability.

In the exemplary embodiment, the terms, such as "upper surface", "lower surface", "upper end", "up-and-down direction", and "downward", indicating directions indicate relative directions determined only by the relative positional relation of components, such as battery cell 17 and heat-conductive sheet 11, of battery pack 21, and do not indicate absolute directions, such as vertical direction.

REFERENCE MARKS IN THE DRAWINGS 11 heat-conductive sheet
12 graphite sheet 14 slit (first slit)
15 slit (second slit)
17 battery cell
18 terminal electrode
21 battery pack
22 case
113 insulating sheet (first insulating sheet)
117 battery cell body
213 insulating sheet (second insulating sheet)
D14 extending direction
D15 extending direction

The invention claimed is:

1. A heat-conductive sheet comprising:
a first insulating sheet;
a second insulating sheet placed on the first insulating sheet; and
a graphite sheet disposed between the first insulating sheet and the second insulating sheet, the graphite sheet being entirely sealed by the first insulating sheet and the second insulating sheet,
wherein the graphite sheet has a first slit provided therein, the first slit extending from a first end of the graphite sheet, and
wherein the first insulating sheet and the second insulating sheet have a second slit passing through the first insulating sheet and the second insulating sheet, the second slit being located inside the first slit of the graphite sheet, the second slit extending from respective first ends of the first insulating sheet and the second insulating sheet.

2. The heat-conductive sheet according to claim 1, wherein the first insulating sheet has a first surface and a second surface opposite to the first surface, the first surface facing the graphite sheet and the second insulating sheet and having adhesiveness, the second surface having adhesiveness.

3. The heat-conductive sheet according to claim 1, wherein the second insulating sheet has a first surface and a second surface opposite to the first surface, the first surface facing the graphite sheet and having adhesiveness, the second surface disposed having adhesiveness.

4. The heat-conductive sheet according to claim 1,
wherein the first slit extends slenderly in an extending direction, and
wherein a width of the first slit in a direction perpendicular to the extending direction is equal to or more than 1.0 mm and equal to or smaller than 2.0 mm.

5. The heat-conductive sheet according to claim 4,
wherein the second slit extends slenderly in an extending direction, and
wherein a width of the second slit in a direction perpendicular to the extending direction of the second slit is equal to or smaller than 0.2 mm.

6. The heat-conductive sheet according to claim 5, wherein the second slit is a cut-out passing through the first insulating sheet and the second insulating sheet.

7. The heat-conductive sheet according to claim 1,
wherein the graphite sheet has a third slit provided therein, the first slit extending from a second end of the graphite sheet which is opposite to the first end of the graphite sheet, and
wherein the first insulating sheet and the second insulating sheet have a fourth slit passing through the first insulating sheet and the second insulating sheet, the second slit being located inside the third slit of the graphite sheet, the fourth slit extending from respective second ends of the first insulating sheet and the second insulating sheet which are opposite to the respective first ends of the first insulating sheet and the second insulating sheet.

8. A battery pack comprising:
a battery cell; and
a heat-conductive sheet attached onto the battery cell,
wherein the battery cell includes:
a battery cell body having an upper surface, a lower surface, and a side surface connected with the upper surface and the lower surface; and
an electrode terminal disposed on the upper surface of the battery cell body,
wherein the heat-conductive sheet includes:
a first insulating sheet attached onto the side surface of the battery cell body;
a second insulating sheet placed on the first insulating sheet; and
a graphite sheet disposed between the first insulating sheet and the second insulating sheet, the graphite sheet being entirely sealed by the first insulating sheet and the second insulating sheet,
wherein the graphite sheet has a first slit provided therein, the first slit extending from a first end of the graphite sheet, and
wherein the first insulating sheet and the second insulating sheet have a second slit passing through the first insulating sheet and the second insulating sheet, the second slit being located inside the first slit of the graphite sheet, the second slit extending from respective first ends of the first insulating sheet and the second insulating sheet.

9. The battery pack according to claim 8, wherein the first slit extends slenderly in a direction which is directed from the upper surface of the battery cell body to the lower surface of the battery cell body.

10. The battery pack according to claim 9, wherein the first slit extends slenderly from the first end of the graphite sheet.

11. The battery pack according to claim 8,
wherein the first end of the graphite sheet is an upper end of the graphite sheet, and
wherein the respective first ends of the first insulating sheet and the second insulating sheet are respective upper ends of the first insulating sheet and the second insulating sheet.

12. The battery pack according to claim 8,
wherein the graphite sheet has a third slit provided therein, the first slit extending from a second end of the graphite sheet which is opposite to the first end of the graphite sheet, and
wherein the first insulating sheet and the second insulating sheet have a fourth slit passing through the first insulating sheet and the second insulating sheet, the second slit being located inside the third slit of the graphite sheet, the fourth slit extending from respective second ends of the first insulating sheet and the second insulating sheet which are opposite to the respective first ends of the first insulating sheet and the second insulating sheet.

13. The battery pack according to claim 12,
wherein the battery cell body of the battery cell further has another side surface connected with the upper surface and the lower surface, the another side surface being opposite to the side surface,
wherein the heat-conductive sheet extends along the side surface, the lower surface, and the another side surface of the battery cell body, and is attached onto the side surface and the another side surface of the battery cell body, wherein the second end of the graphite sheet is another upper end of the graphite sheet, and wherein the respective second ends of the first insulating sheet and the second insulating sheet are respective another upper ends of the first insulating sheet and the second insulating sheet.

14. The battery pack according to claim 13, wherein the heat-conductive sheet is attached onto the side surface, the lower surface, and the another side surface of the battery cell body.

15. A battery pack comprising:
a plurality of battery cells; and
a plurality of heat-conductive sheets attached onto the plurality of battery cells,
wherein each of the plurality of battery cells includes:
a battery cell body having an upper surface, a lower surface, and a side surface connected with the upper surface and the lower surface; and
an electrode terminal disposed on the upper surface of the battery cell body,
wherein each of the plurality of battery cells is attached onto respective one of the plurality of heat-conductive sheets,
wherein each of the plurality of heat-conductive sheets includes:
a first insulating sheet attached onto the side surface of the battery cell body of the respective one of the plurality of battery cells;
a second insulating sheet placed on the first insulating sheet; and
a graphite sheet disposed between the first insulating sheet and the second insulating sheet, the graphite sheet being entirely sealed by the first insulating sheet and the second insulating sheet,
wherein the graphite sheet has a first slit disposed therein, the first slit extending from a first end of the graphite sheet, and
wherein the first insulating sheet and the second insulating sheet have a second slit passing through the first insulating sheet and the second insulating sheet, the second slit being located inside the first slit of the graphite sheet, the second slit extending from respective first ends of the first insulating sheet and the second insulating sheet.

16. The battery pack according to claim 15, wherein the first slit extends slenderly in a direction which is directed from the upper surface of the battery cell body to the lower surface of the battery cell body.

17. The battery pack according to claim 16, wherein the first slit extends slenderly from the first end of the graphite sheet.

18. The battery pack according to claim 15, further comprising a case accommodating the plurality of battery cells and the plurality of heat-conductive sheets therein.

19. The battery pack according to claim 15,
wherein the first end of the graphite sheet of the each of the plurality of heat-conductive sheets is an upper end of the graphite sheet, and
wherein the respective first ends of the first insulating sheet and the second insulating sheet of the each of the plurality of heat-conductive sheets are respective upper ends of the first insulating sheet and the second insulating sheet.

20. The battery pack according to claim 15,
wherein the graphite sheet of the each of the plurality of heat-conductive sheets has a third slit provided therein, the first slit extending from a second end of the graphite sheet which is opposite to the first end of the graphite sheet, and
wherein the first insulating sheet and the second insulating sheet of the each of the plurality of heat-conductive sheets have a fourth slit passing through the first insulating sheet and the second insulating sheet of the each of the plurality of heat-conductive sheets, the second slit being located inside the third slit of the graphite sheet, the fourth slit extending from respective second ends of the first insulating sheet and the second insulating sheet which are opposite to the respective first ends of the first insulating sheet and the second insulating sheet.

21. The battery pack according to claim 20,
wherein the battery cell body of the each of the plurality of battery cells further has another side surface connected with the upper surface and the lower surface, the another side surface being opposite to the side surface,
wherein the each of the plurality of heat-conductive sheets extends along the side surface, the lower surface, and the another side surface of the battery cell body of the each of the plurality of the battery cell, and is attached onto the side surface and the another side surface of the battery cell body,
wherein the second end of the graphite sheet of the each of the plurality of heat-conductive sheets is another upper end of the graphite sheet, and
wherein the respective second ends of the first insulating sheet and the second insulating sheet of the each of the plurality of heat-conductive sheets are respective another upper ends of the first insulating sheet and the second insulating sheet.

22. The battery pack according to claim 21, wherein each of the plurality of heat-conductive sheets is attached onto the side surface, the lower surface, and the another side surface of the battery cell body.

* * * * *